United States Patent
Bullard et al.

(10) Patent No.: US 8,628,861 B2
(45) Date of Patent: *Jan. 14, 2014

(54) METALLURGICALLY BONDED STAINLESS STEEL

(71) Applicant: Arcanum Alloy Design Inc., Sunnyvale, CA (US)

(72) Inventors: Daniel E. Bullard, Valparaiso, IN (US); Joseph E. McDermott, Sunnyvale, CA (US)

(73) Assignee: Arcanum Alloy Design Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/800,698

(22) Filed: Mar. 13, 2013

(65) Prior Publication Data

US 2013/0252022 A1    Sep. 26, 2013

Related U.S. Application Data

(63) Continuation-in-part of application No. 13/629,699, filed on Sep. 28, 2012.

(60) Provisional application No. 61/581,239, filed on Dec. 29, 2011, provisional application No. 61/581,241, filed on Dec. 29, 2011.

(51) Int. Cl.
*B32B 15/18* (2006.01)
*C23C 30/00* (2006.01)

(52) U.S. Cl.
USPC ............ 428/685; 428/941; 148/529; 148/537

(58) Field of Classification Search
None
See application file for complete search history.

(56) References Cited

U.S. PATENT DOCUMENTS 2,402,834 A    6/1946 Nachtman
2,859,158 A *  11/1958 Schaer .......................... 205/180

(Continued)

FOREIGN PATENT DOCUMENTS

DE    3201641    *  7/1983
EP    0204318 A    12/1986

(Continued)

OTHER PUBLICATIONS

A.R. Castle, D.R. Gabe; Chromium diffusion coatings; International Materials Review; 1999; 44(2); 37-59; ASM International, USA.

(Continued)

*Primary Examiner* — John J Zimmerman
(74) *Attorney, Agent, or Firm* — Synthesis Intellectual Property, LLC; Jonathan T. Goodman

(57) ABSTRACT

Herein are disclosed steel forms having stainless steel exteriors that pass a 0T-bend Advanced T-bend Test. One steel form has a stainless steel exterior; the steel form includes a core region that comprises at least 55 wt. % iron which is metallurgically bonded to a stainless steel coating that consists of a stainless steel region and a bonding region. The stainless steel region can have a thickness of about 1 μm to about 250 μm, and a stainless steel composition that is approximately consistent across the thickness of the stainless steel region. The stainless steel composition can include an admixture of iron and about 10 wt. % to about 30 wt. % chromium. The bonding region is positioned between the stainless steel region and the core region, has a thickness that is greater than 1 μm and less than the thickness of the stainless steel region, and has a bonding composition. The bonding composition can include an admixture of iron and chromium, with a chromium concentration proximal to the stainless steel region that is approximately equal to the chromium concentration of the stainless steel region and has a chromium concentration proximal to the core region that has less than about 5 wt. % chromium.

17 Claims, 22 Drawing Sheets

(56) References Cited

U.S. PATENT DOCUMENTS

| | | | |
|---|---|---|---|
| 3,165,823 A | 1/1965 | Rowady | |
| 3,184,331 A * | 5/1965 | Carter | 427/398.3 |
| 3,222,212 A | 12/1965 | Samuel et al. | |
| 3,294,498 A | 12/1966 | Carter | |
| 3,312,546 A | 4/1967 | Mayer et al. | |
| 3,403,988 A | 10/1968 | Carter | |
| 3,414,428 A | 12/1968 | Kelly et al. | |
| 3,615,902 A | 10/1971 | Lesney | |
| 3,642,517 A * | 2/1972 | Faber | 148/518 |
| 3,762,884 A * | 10/1973 | Grisaffe et al. | 428/610 |
| 3,775,151 A | 11/1973 | Baker et al. | |
| 3,998,603 A * | 12/1976 | Rairden, III | 428/651 |
| 4,119,701 A * | 10/1978 | Fedor et al. | 423/213.2 |
| 4,485,148 A * | 11/1984 | Rashid et al. | 428/610 |
| 4,526,817 A * | 7/1985 | Rausch et al. | 148/530 |
| 5,015,535 A * | 5/1991 | Marquez et al. | 428/610 |
| 6,139,649 A * | 10/2000 | Wynns | 148/277 |
| 2003/0178314 A1 | 9/2003 | Polinski et al. | |
| 2006/0257683 A1 | 11/2006 | Polinski et al. | |
| 2008/0076683 A1 | 3/2008 | Okamoto et al. | |
| 2008/0251389 A1 | 10/2008 | Kingston | |
| 2010/0167087 A1* | 7/2010 | Wijenberg et al. | 428/680 |
| 2010/0243192 A1 | 9/2010 | Balasubramanian et al. | |
| 2011/0269051 A1 | 11/2011 | Wijenberg et al. | |
| 2012/0189868 A1 | 7/2012 | Borovik et al. | |

FOREIGN PATENT DOCUMENTS

| | | | |
|---|---|---|---|
| EP | 1844176 B1 | | 4/2011 |
| GB | 1035827 A | | 7/1966 |
| JP | 47-33244 | * | 8/1972 |
| JP | 57-143489 | * | 9/1982 |
| JP | 58-177459 | * | 10/1983 |
| JP | 58-181860 | * | 10/1983 |
| JP | 59-140392 | * | 8/1984 |
| JP | 60-177176 | * | 9/1985 |
| JP | 60-230995 | * | 11/1985 |
| JP | 61-797758 | * | 4/1986 |
| JP | 62-297491 | * | 12/1987 |
| JP | 63-499 | * | 1/1988 |
| JP | 64-87761 | * | 3/1989 |
| JP | 1-195268 | * | 8/1989 |
| JP | 2-274866 | * | 11/1990 |
| JP | 3-197693 | * | 8/1991 |
| JP | 4-72091 | * | 3/1992 |
| JP | 07-310166 | * | 11/1995 |
| JP | 07-310167 | * | 11/1995 |
| JP | 10-226873 | * | 8/1998 |

OTHER PUBLICATIONS

E. Zamani, G.H. Liaghat; Explosive welding of stainless steel-carbon steel coaxial pipes; J. Mater. Sci.; 2012; 47; 685-695.

G.A. Davies, A.B. Ponter, I.A. Menzies, "The Diffusion of Chromium in Iron and Low Carbon Steels", Acta Metallurgica, 1967, pp. 1799-1804, vol. 15.

G.H. Meier, C.Cheng, R.A. Perkings, W.Bakker; Diffusion Chromizing of Ferrous Alloys; Surface and Coating Technology; 1989; 39/40; 53-64.

K. Zhang, K. Zhang, H.X. Li, G.N. Chen, "Interface fracture behavior of electroplated coating on metal substrate under compresive strain", J. Materials Processing Tech., 2009, pp. 1337-1341, vol. 209.

K.Kawamura, T.Watanabe, K.Nishizaka; Determination of Surface Chromium Contents of Chromized Steel by Fluorescent X-ray Analysis; Transactions of the Japan Institute of Metals; 1969; 10; 267-270.

Philippe, L., Heiss, C., Michler, J. "Electroplating of Stainless Steel", Chem. Mater., (2008) 20, 3377-3384.

R. Braun, M. Feller-Kniepmeier, "Diffusion of Chromium in alpha-Iron", Phys. Stat. Sol. (a), 1985, pp. 553-561, vol. 90/2.

R.G.I. Leferink, H. Barten, W.M.M. Huijbregts, "Chromium Diffusion Coatings on Low-Alloyed Steels for Corrosion Protection Under Sulphidizing Conditions", VGB Kraftwerkstecknick, 1993, pp. 1-14, vol. 73/3.

S.K. Gupta, S.R. Adolph, L.C. Tandon, L.L. Seigle, "Experimental and Theoretical Concentration Profiles at the Surface of Chromized Iron", Metallurgical Trans. (A), 1982, pp. 495-497, vol. 13A.

T.Yamashita; Microstructure of Austenitic Stainless Steel Explosively Bonded to Low Carbon-Steel; J. Electron Micro.; 1973; 22(1); 13-18.

Written Opinion of the International Searching Authority, PCT/US2012/070469, Feb. 8, 2013.

Z.B. Wang, J.Lu, K.Lu; Chromizing behaviors of a low carbon steel processed by means of surface mechanical attrition treatment; Acta Materialia; 2005, 53, 2081-2089.

International Search Report and Written Opinion, PCT/US2013/030902, Aug. 19, 2013.

\* cited by examiner

METALLURGICALLY BONDED STAINLESS STEEL

CROSS-REFERENCE TO RELATED APPLICATIONS

This disclosure claims the benefit of priority to U.S. patent application Ser. No. 13/629,699 filed on 28 Sep. 2012 which claims the benefit of priority to U.S. Provisional Patent Applications No. 61/581,239 filed 29 Dec. 2011, and No. 61/581,241 filed 29 Dec. 2011, the disclosures of which are incorporated herein in their entirety

FIELD OF THE INVENTION

This disclosure is directed to a non-stainless steel product metallurgically bonded to and carrying a stainless steel outer layer that passes 0T-bend tests.

BACKGROUND

Steel is one of the most ubiquitous structural materials in the world. Unfortunately, steel is prone to oxidation and thereby structural and decorative failure. Many techniques have been developed to attempt to provide a protective coating for steel; these include galvanizing, galvannealing, chromizing, cladding, painting and the like.

A good method for protecting steel is providing a stainless steel composition on the exterior of the steel product. Chromizing is a common method for the production of chromium-iron alloys, thereby stainless steels, on the surface of steels. Chromizing steel involves thermal deposition-diffusion processes whereby chromium is diffused into the steel and produces a varying concentration of chromium in the steel substrate. Typically, the surface of the substrate has the highest chromium concentration and as the distance into the substrate increases the chromium concentration falls off. Often the chromium concentration follows a typical diffusion function, that is, the chromium concentration decreases exponentially as a function of distance from the substrate. Other chromizing products, such as that described in U.S. Pat. No. 3,312,546, include diffusion coatings that have chromium concentrations above 20% that decrease linearly as a function of distance into the substrate (see FIG. 13). These high chromium-content coatings appear to include a foil or layer of chromium containing material carried by the bulk substrate.

The decreasing concentration of chromium as a function of depth into the substrate can affect the corrosion resistance of the material. That is, abrasion of the surface continuously produces new layers with lower chromium concentrations that are well understood to be less corrosion resistant than the initial surface. This undesirable effect, due to the variable concentration of chromium in the chromized surfaces, has been overcome by the advent of explosive cladding.

Explosive welding or cladding of stainless steel onto a carbon steel produces a stainless steel layer with a consistent composition metallurgically bonded to a carbon steel substrate. This technique overcomes the variable concentrations associated with chromizing but is severely limited by the thicknesses of the flying layer, the use of high explosives, and the metallurgical bond that is formed. Two types of metallurgical bonds have been observed in explosively welding metals: under high explosive loading the cross-section to be composed of a wave-like intermixing of the base and flying layers and under lower explosive loadings the cross-section includes an implantation of grains of the flying layer into the base layer. E.g. see: Explosive welding of stainless steel—carbon steel coaxial pipes, *J. Mat. Sci.*, 2012, 47-2, 685-695; and Microstructure of Austenitic stainless Steel Explosively Bonded to low Carbon-Steel, *J. Electron Microsc.* (*Tokyo*), 1973, 22-1, 13-18.

The prior art fails to teach a material that includes a stainless steel layer with a consistent composition diffusion bonded to a carbon steel substrate. Ideally, such a material would include the corrosion resistance associated with the explosively welded stainless steel and the deep diffusion bonding observed typical of chromizing applications.

SUMMARY

A first embodiment includes a steel form that passes a 0T-bend Advanced T-Bend Test and has a stainless steel exterior, the steel form including a core region, a bonding region and a stainless steel region; the core region metallurgically bonded to the stainless steel region by the bonding region; the core region comprising at least 55 wt. % iron; the stainless steel region having a thickness of about 1 μm to about 250 μm, having a stainless steel composition, and including the stainless steel exterior, the stainless steel composition being approximately consistent across the thickness of the stainless steel region; and the bonding region positioned between the stainless steel region and the core region, the bonding region having a thickness that is greater than 1 μm and less than the thickness of the stainless steel region, and having a bonding composition, the bonding composition having a chromium concentration proximal to the stainless steel region that is approximately equal to the chromium concentration of the stainless steel region and having a chromium concentration proximal to the core region that has less than about 5 wt. % chromium; wherein the steel form passes a 0T-bend Advanced T-Bend Test.

Another embodiment is a steel sheet that includes a first stainless steel region having a thickness of about 1 μm to about 250 μm, preferably about 5 μm to about 200 μm, about 10 μm to about 150 μm, or about 10 μm to about 100 μm; a first bonding region positioned between the first stainless steel region and a core region, the first bonding region having a thickness that is greater than 1 μm and less than the thickness of the first stainless steel region; the core region having a thickness of about 100 μm to about 4 mm, preferably about 100 μm to about 3 mm, about 100 μm to about 2 mm, about 100 μm to about 1 mm, or about 100 μm to about 0.5 mm, the core region having a core composition that comprises at least 85 wt. % iron; a second bonding region positioned between the core region and a second stainless steel region; the second stainless steel region having a thickness of about 1 μm to about 250 μm; the second bonding region having a thickness that is greater than 1 μm and less than the thickness of the second stainless steel region; the first and second stainless steel regions having stainless steel compositions that are approximately consistent across the thickness of the respective stainless steel regions, the stainless steel compositions, individually, comprising an admixture of iron and chromium, and a chromium concentration of about 10 wt. % to about 30 wt. %; and the first and second bonding regions having bonding compositions, the bonding composition, individually, comprising an admixture of iron and chromium, having a chromium concentration proximal to the respective stainless steel region that is approximately equal to the chromium concentration of the stainless steel region and having a chromium concentration proximal to the core region that has less than about 5 wt. % chromium; wherein the steel sheet passes the 0T-bend Advanced T-Bend Test.

Still another embodiment is a steel form that includes a brushed or polished stainless steel surface carried by a stainless steel region; the stainless steel region having a thickness of about 5 μm to about 200 μm, having an approximately consistent stainless steel composition that includes an admixture of iron and chromium, and a chromium concentration of about 10 wt. % to about 30 wt. %, the stainless steel region carried by a bonding region; the bonding region having a thickness of about 5 μm to about 200 μm but less than the thickness of the stainless steel region, the bonding region metallurgically bonding the stainless steel region to a core region; the core region having a core composition that includes at least 85 wt. % iron; the bonding region further comprising a bonding composition that includes an admixture of iron and chromium, and a bonding region concentration gradient that decreases from a chromium concentration proximal to the stainless steel region that is approximately equal to the chromium concentration of the stainless steel region to a chromium concentration proximal to the core region that is less than about 1 wt. %; wherein the steel form passes the 0T-bend Advanced T-Bend Test.

BRIEF DESCRIPTION OF THE FIGURES

For a more complete understanding of the disclosure, reference should be made to the following detailed description and accompanying drawing figures wherein.

Figure 1:
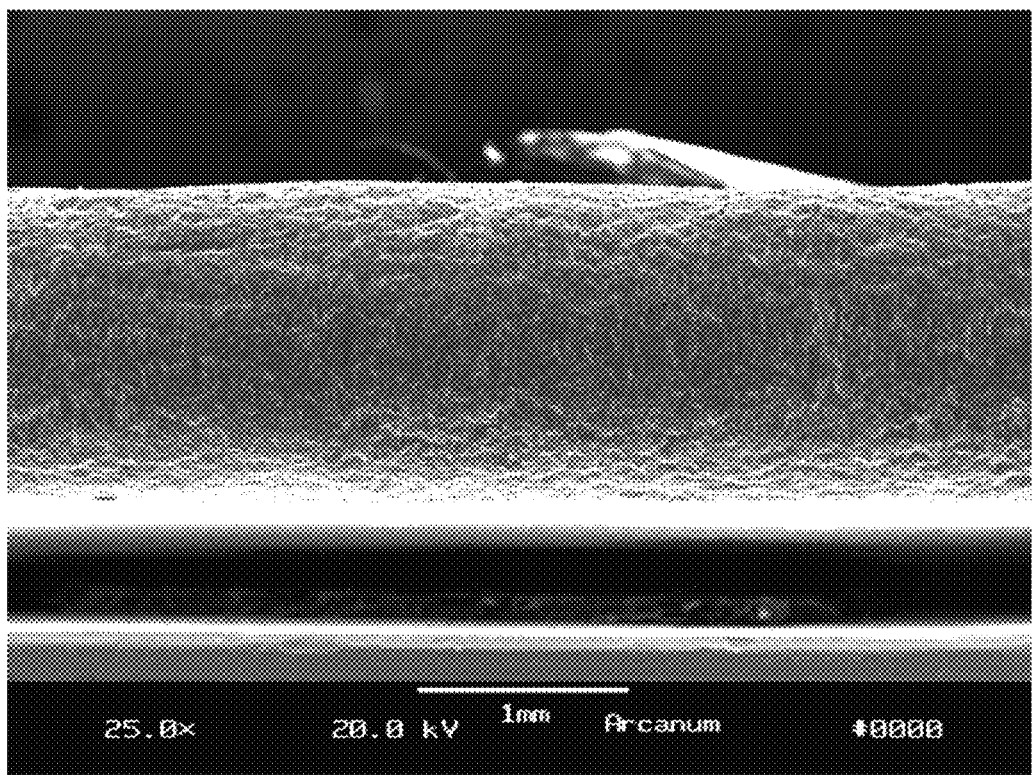
FIG. 1 is an SEM image at 25× of the point of maximum elongation in a 0T-bend for a herein described product that passes the 0T-bend Advanced T-Bend Test.

While specific embodiments are illustrated in the figures, with the understanding that the disclosure is intended to be illustrative, these embodiments are not intended to limit the invention described and illustrated herein.

DETAILED DESCRIPTION

The term "admixture" as related to a plurality of metals, preferably transition metals, means the metals are intermixed in a given region. An admixture can be further described as a solid solution, an alloy, a homogeneous admixture, a heterogeneous admixture, a metallic phase, or one of the preceding further including an intermetallic or insoluble structure, crystal, or crystallite. Importantly, the term "admixture" as used herein expressly excludes intermixed grains or crystals or inter-soluble materials. That is, the herein described admixtures do not include distinguishable grains of compositions that can form a solid solution, a single metallic phase or the like, for example by heating the admixture to a temperature where the grains of compositions could inter-diffuse. Notably, an admixture can include intermetallic species as these intermetallic species are not soluble in the "solute" or bulk metallic phase. Furthermore, this exclusion of intermixed-intersoluble materials does not limit the homogeneity of the sample; a heterogeneous admixture can include a concentration gradient of at least one of the metals in the admixture but does not include distinguishable grains or crystals of one phase or composition intermixed with grains, with crystals, or in a solute having a second phase of composition in which the first phase of composition is soluble.

The noun "alloy", as related to an admixture of metals, means a specific composition of metals, preferably transition metals, with a narrow variation in concentration of the metals throughout the admixture. One example of an alloy is 304 stainless steel that has an iron composition that includes about 18-20 wt. % Cr, about 8-10.5 wt. % Ni, and about 2 wt. % Mn. As used herein, an alloy that occupies a specific volume does not include a concentration gradient. Such a specific volume that includes a concentration gradient would include, as an admixture, a plurality or range of alloys.

Herein, the term "concentration gradient" refers to the regular increase or decrease in the concentration of at least one element in an admixture. Typically, a concentration gradient is observed in an admixture where at least one element in the admixture increases or decreases from a set value to a higher/lower set value. The increase or decrease can be linear, parabolic, Gaussian, or mixtures thereof. Typically, a concentration gradient is not a step function. A step function variation is better described as a plurality of abutting admixtures.

Layers and/or regions of the herein described materials are referred to as being "metallurgically bonded." That is, the metals, alloys or admixtures that provide the composition of the layers and/or regions are joined through a conformance of lattice structures. No intermediate layers such as adhesives or braze metal are involved. Bonding regions are the areas in which the metallurgical bonds between two or more metals, alloys or admixtures display a conformance of lattice structures. The conformance of lattice structures being the gradual change from the lattice of one metal, alloy or admixture to the lattice of the metallurgically bonded metal, alloy or admixture.

While terms used herein are typical for the steel industry, the herein disclosed compositions or regions may consist of, or consist essentially of, one or more elements. Notably, steel is considered to be carbon steel, that is a mixture of at least iron and carbon, and generally contains up to 2% total alloying elements; including carbon, chromium, cobalt, niobium, molybdenum, nickel, titanium, tungsten, vanadium, zirconium or other metals. Thereby, steel or carbon steel does not consist of, or consist essentially of, one or more elements but can be random composition of a variety of elements supported in iron. When compositions or regions are described as consisting of, or consisting essentially of, one or more elements, the concentration of non-disclosed elements in the composition or region are not detectable by energy-dispersive X-ray spectroscopy (EDX) (e.g., EDX has a typical sensitivity down to levels of about 0.5 to 1 atomic percent). When the composition or region is described as consisting of one or more elements, the concentration of the non-disclosed elements in the composition or region is not detectable or within the measurable error of direct elemental analysis, e.g., by ICP.

The herein described material includes a variety of metallurgically bonded metals, alloys or admixtures. The composition or concentration of transition metals in the metals, alloys or admixtures is an important feature of the herein described materials. Equally important is the variation of the compositions or concentrations as a function of depth or distance through the material. Accordingly, herein, the composition or concentrations of the component metals in the described metals, alloys or admixtures is determined by EDX. Furthermore, herein, when a composition is termed "approximately consistent" over a distance, in a layer, or in a region, the term means that the relative percentage of metals in that distance, layer or region is consistent within the standard error of measurement by EDX. Preferably, the moving average over the "approximately consistent" distance, layer or region has a slope of about zero when plotted as a function of concentration (y-axis) to distance (x-axis). More preferably, the concentration (or relative percentage) of the individual elements in the composition vary by less than about 5 wt. %, 4 wt. %, 3 wt. %, 2 wt. %, or 1 wt. % over the distance.

A first embodiment is a steel form having a stainless steel exterior. The steel form includes a core region which carries a stainless steel coating; that is, the steel form includes the core region, a bonding region, and a stainless steel region, where the bonding region metallurgically bonds the core region to the stainless steel region. Herein, the steel form is defined by layers or regions that include at least 55 wt. % iron, notably, the steel form can be coated by, for example, organic or inorganic coatings but these coatings are not, herein, part of the steel form. The core region of the steel form includes iron, preferably includes at least 55 wt. % iron. More preferably, the iron concentration in the core region is greater than 98 wt. %, 99 wt. %, or 99.5 wt. %. Even more preferably, the core region is a carbon steel having a carbon concentration of less than about 0.5 wt. %. Still more preferably, the core region is a carbon steel having a carbon concentration of less than about 0.25 wt. %. Even still more preferably, the core region is substantially free of chromium and/or substantially free of nickel.

The stainless steel coating carried by the core region consists of a stainless steel region and a bonding region; the bonding region proximal to the core region and the stainless steel region including the stainless steel exterior. The stainless steel region, preferably, has a thickness of about 1 μm to about 250 μm, about 5 μm to about 250 μm, about 10 μm to about 250 μm, about 25 μm to about 250 μm, about 50 μm to about 250 μm, about 10 μm to about 200 μm, or about 10 μm to about 100 μm.

The stainless steel region has a stainless steel composition. Herein, a stainless steel composition means that the stainless steel region includes an admixture of iron and chromium, specifically, the stainless steel composition includes a chromium concentration of about 10 wt. % to about 30 wt. %, for example the chromium concentration can be about 10 wt. %, about 12 wt. %, about 14 wt. %, about 16 wt. %, about 18 wt. %, about 20 wt. %, about 22 wt. %, about 24 wt. %, about 26 wt. %, about 28 wt. %, or about 30 wt. %. Preferably, the stainless steel composition is approximately consistent across the thickness of the stainless steel region.

The stainless steel composition includes an admixture of iron and chromium, and can further include a transition metal selected from the group consisting of nickel, molybdenum, titanium, niobium, tantalum, vanadium, tungsten, copper, and a mixture thereof. In one example, the stainless steel composition comprises an admixture of iron, chromium, and nickel, and comprises a nickel concentration of about 5 wt. % to about 20 wt. %. In this example, the bonding composition (as described below) consists essentially of iron, chromium and nickel.

In one preferable example, the stainless steel composition has a chromium concentration of about 16 wt. % to about 25 wt. %, and nickel concentration of about 6 wt. % to about 14 wt. %. In another preferable example, the stainless steel composition consists essentially of iron, chromium and nickel.

In another example, the stainless steel composition can have a chromium concentration of about 10.5 wt. % to about 18 wt. %. In still another preferable example, the stainless steel composition consists essentially of iron and chromium; and the bonding composition consists essentially of iron and chromium.

As stated previously, the stainless steel coating includes the stainless steel region and the bonding region which is positioned between the stainless steel region and the core region. The bonding region, preferably, has a thickness that is greater than 1 μm and less than the thickness of the stainless steel region. More preferably, the bonding region has a thickness of about 5 μm to about 200 μm, about 5 μm to about 100 μm, or about 10 μm to about 50 μm.

The bonding region has a bonding composition, which includes an admixture of iron and chromium. The bonding composition further includes a chromium concentration proximal to the stainless steel region that is approximately equal to the chromium concentration of the stainless steel region and having a chromium concentration proximal to the core region that has less than about 5 wt. %, about 4 wt. %, about 3 wt. %, about 2 wt. %, about 1 wt. %, or about 0.5 wt. % chromium. That is, the chromium concentration falls through the boding region to a concentration that is less than half of the concentration in the stainless steel region, preferably falls to a concentration that is approximately equal to the concentration of chromium in the core region. The chromium concentration gradient in the bonding region can include a linear decrease in chromium concentration or a sigmoidal decrease in chromium concentration, preferably the sigmoidal decrease.

In one example, the steel form has a thickness of about 100 μm to about 4 mm, preferably about 100 μm to about 3 mm, about 100 μm to about 2 mm, about 100 μm to about 1 mm, or about 100 μm to about 0.5 mm. Preferably the steel form has a thickness (that is the sum of the core, bonding and stainless steel regions) that is less than 3 mm, 2 mm, 1 mm or 0.5 mm.

Figure 10:
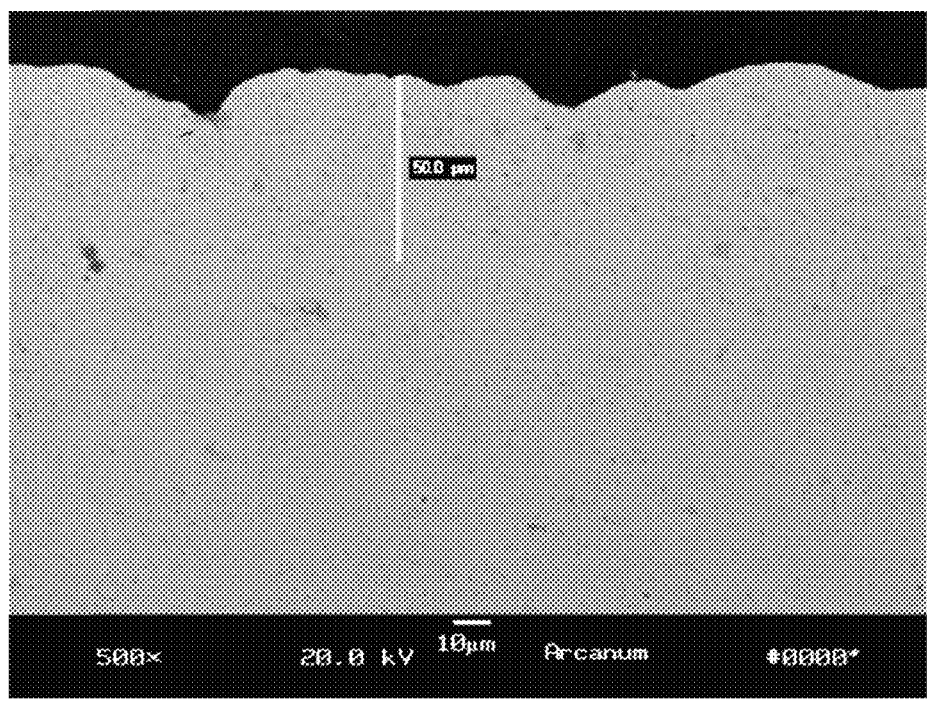
FIG. 10 is a backscattering SEM of the sample shown in FIG. 9.

Another embodiment is a steel sheet that includes a plurality of regions, including a first stainless steel region, a first bonding region positioned between the first stainless steel region and a core region, the core region, a second bonding region positioned between the core region and a second stainless steel region, and the second stainless steel region (e.g., see FIG. 10). In this embodiment, the first stainless steel region has a thickness of about 1 µm to about 250 µm, preferably about 5 µm to about 200 µm, about 10 µm to about 150 µm, or about 10 µm to about 100 µm; the first bonding region has a thickness that is greater than 1 µm and less than the thickness of the first stainless steel region; the core region having a thickness of about 100 µm to about 4 mm, preferably about 100 µm to about 3 mm, about 100 µm to about 2 mm, about 100 µm to about 1 mm, or about 100 µm to about 0.5 mm; the second stainless steel region having a thickness of about 1 µm to about 250 µm, preferably about 5 µm to about 200 µm, about 10 µm to about 150 µm, or about 10 µm to about 100 µm; and the second bonding region having a thickness that is greater than 1 µm and less than the thickness of the second stainless steel region.

Preferably, the core region has a core composition that comprises at least 85 wt. % iron. More preferably, the iron concentration in the core region is greater than 98 wt. %, 99 wt. %, or 99.5 wt. %. Even more preferably, the core region is a carbon steel having a carbon concentration of less than about 0.5 wt. %. Still more preferably, the core region is a carbon steel having a carbon concentration of less than about 0.25 wt. %. Even still more preferably, the core region is substantially free of chromium.

The first and second stainless steel regions have stainless steel compositions that are approximately consistent across the thickness of the respective stainless steel regions. These stainless steel compositions, individually, include an admixture of iron and chromium with a chromium concentration of about 10 wt. % to about 30 wt. %, for example the chromium concentration can be about 10 wt. %, about 12 wt. %, about 14 wt. %, about 16 wt. %, about 18 wt. %, about 20 wt. %, about 22 wt. %, about 24 wt. %, about 26 wt. %, about 28 wt. %, or about 30 wt. %.

The first and second bonding regions having bonding compositions that include an admixture of iron and chromium. Individually, the bonding regions have chromium concentrations proximal to the respective stainless steel regions that are approximately equal to the chromium concentration of the stainless steel region and have chromium concentrations proximal to the core region that has less than about 5 wt. %, about 4 wt. %, about 3 wt. %, about 2 wt. %, about 1 wt. %, or about 0.5 wt. % chromium, preferably the chromium concentrations proximal to the core region are approximately equal to the chromium concentration in the core region. That is, the individual bonding regions each have a chromium concentration gradient. The chromium concentration gradient in the bonding region can include a linear decrease in chromium concentration or a sigmoidal decrease in chromium concentration, preferably a sigmoidal decrease.

In one example, the first and second stainless steel composition, individually, comprises an admixture of iron, chromium, and nickel, with a nickel concentration of about 5 wt. % to about 20 wt. %. In this example the respective first and second bonding compositions also include nickel.

In another example, the first and second stainless steel composition, individually, comprises an admixture of iron, chromium, and a transition metal selected from the group consisting of nickel, molybdenum, titanium, niobium, tantalum, vanadium, tungsten, copper, and a mixture thereof. In this example, the respective bonding compositions would also include the selected transition metal(s).

Preferably, the steel sheet that includes the above described regions has a thickness (a steel sheet thickness) of about 0.1 mm to about 4 mm, preferably about 0.1 mm to about 3 mm, about 0.1 mm to about 2 mm, about 0.1 mm to about 1 mm, or about 0.1 mm to about 0.5 mm. The thickness is the lesser of the height, length, or width of the material. For a typical sheet, the length and width are multiple orders of magnitude greater than the height (or thickness). For example the steel sheet can be a steel coil with a width of about 1 meter to about 4 meters and a length of greater than 50 meters.

The individual stainless steel regions can have the same or different thicknesses; preferably the first and second stainless steel regions have approximately the same thickness (e.g., ±5%). In one example, the first stainless steel region has a thickness of about 10 µm to about 100 µm. In another example the second stainless steel region has a thickness of about 10 µm to about 100 µm. The individual bonding regions can have the same or different thicknesses; preferably the first and second bonding regions have approximately the same thickness (e.g., ±5%). In another example, the first bonding region has a thickness of about 5 µm to about 100 µm. In still another example, the second bonding region has a thickness about 5 µm to about 100 µm.

Still another embodiment is a steel form that includes a brushed or polished stainless steel surface carried by a stainless steel region. In this embodiment, the stainless steel region can have a thickness of about 5 µm to about 200 µm, about 10 µm to about 150 µm, or about 10 µm to about 100 µm, has an approximately consistent stainless steel composition that includes an admixture of iron and chromium, and can have a chromium concentration of about 10 wt. % to about 30 wt. %. The stainless steel region is carried by a bonding region. Preferably, the bonding region has a thickness of about 5 µm to about 200 µm but less than the thickness of the stainless steel region. The bonding region metallurgically bonds the stainless steel region to a core region. The core region has a core composition that includes at least 85 wt. % iron. The bonding region further includes a bonding composition which includes an admixture of iron and chromium, and a bonding region concentration gradient that decreases from a chromium concentration proximal to the stainless steel region that is approximately equal to the chromium concentration of the stainless steel region to a chromium concentration proximal to the core region that is less than about 1 wt. %.

In one example, the steel form can be a steel sheet having two major surfaces (e.g., a steel plate or steel coil). The stainless steel region and the bonding region can be carried by one or both of the major surfaces, that is, the steel form can have one or two stainless steel surfaces. In one example, the steel form has only one stainless steel surface, that is, the stainless steel region and the bonding region are carried by one major surface of the steel sheet. Preferably, the steel form (e.g., when a steel plate, coil or wire) has a thickness of about 0.1 mm to about 2 mm, about 0.1 mm to about 1 mm, or about 0.1 mm to about 0.5 mm.

In addition to the description of the embodiments provided above, the herein described products are preferably free of plastic deformation. Plastic deformation is the elongation or stretching of the grains in a metal or admixture brought about by the distortion of the metal or admixture. For example, cold rolled steel with display plastic deformation in the direction of the rolling. Plastic deformation in steel is easily observable and quantifiable through the investigation of a cross-section of the steel. Herein, the products are preferably substantially free of plastic deformation; that is the products include less than 15%, 10%, or 5% plastic deformation. More preferably, the products described herein are essentially free of plastic deformation; that is, the products include less than 1% plastic deformation. Even more preferably, the products described herein are free of plastic deformation; that is, plastic deformation in the described products is not observable by investigation of a cross section of the product.

Figure 14:
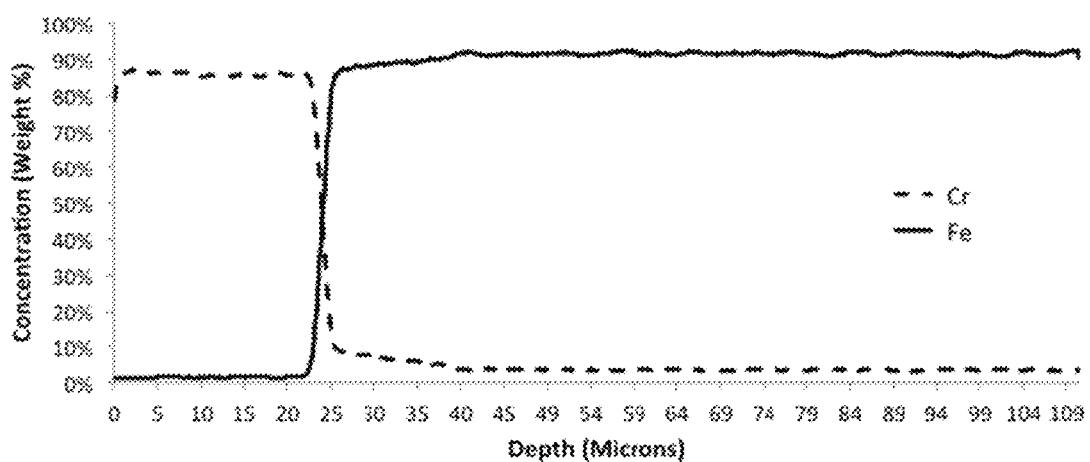
FIG. 14 is a plot of chromium and iron concentrations as a function of depth for a precursor to a 400 series product.
Figure 15:
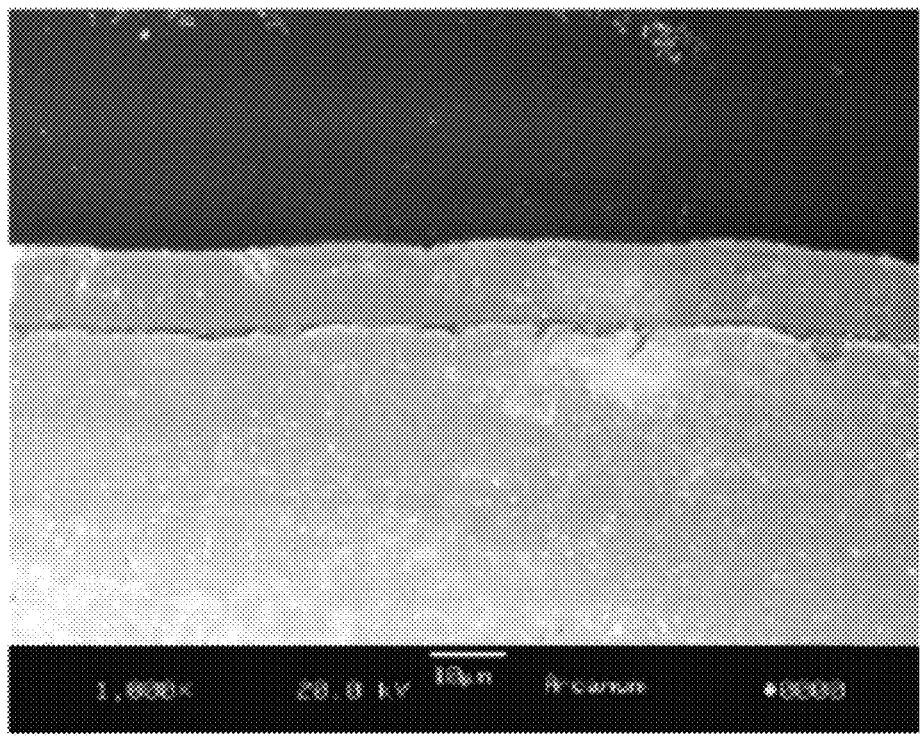
FIG. 15 is a cross section SEM image of the precursor to the 400 series product.
Figure 18:
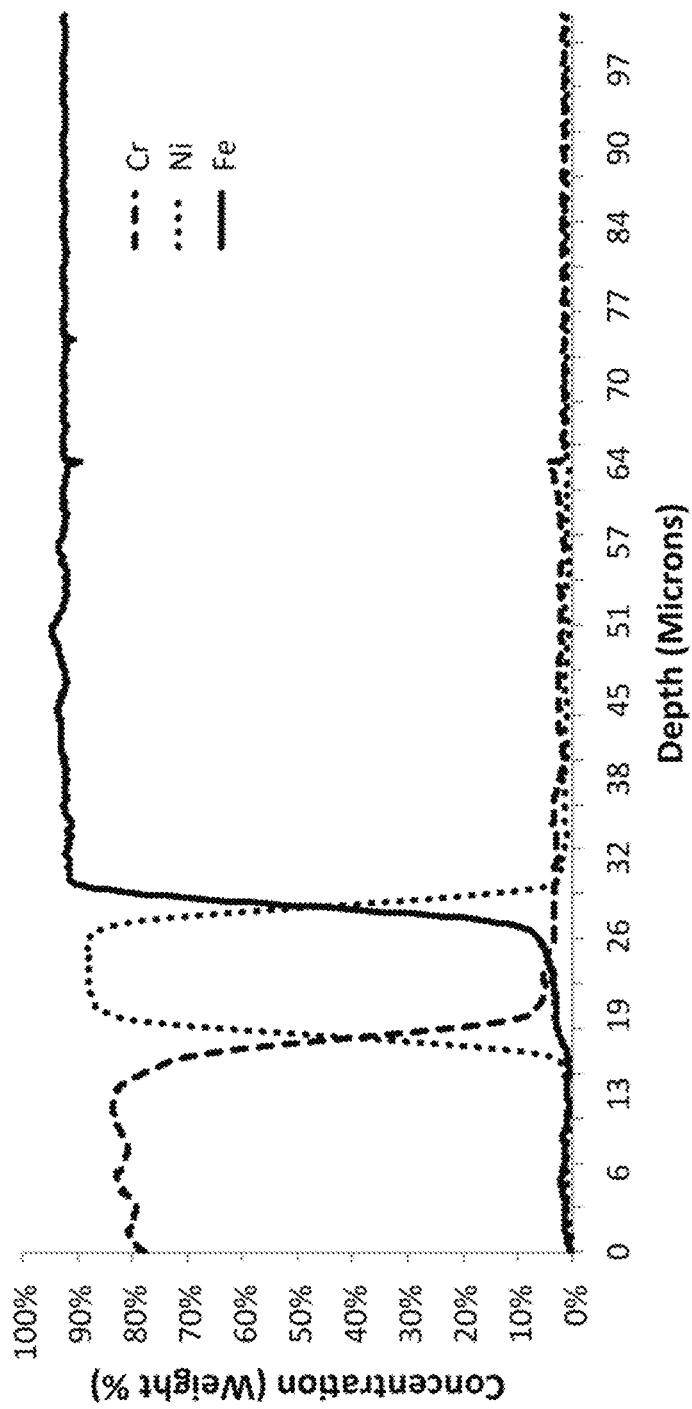
FIG. 18 is a plot of chromium, nickel, and iron concentrations as a function of depth for a precursor to a 300 series product.
Figure 19:
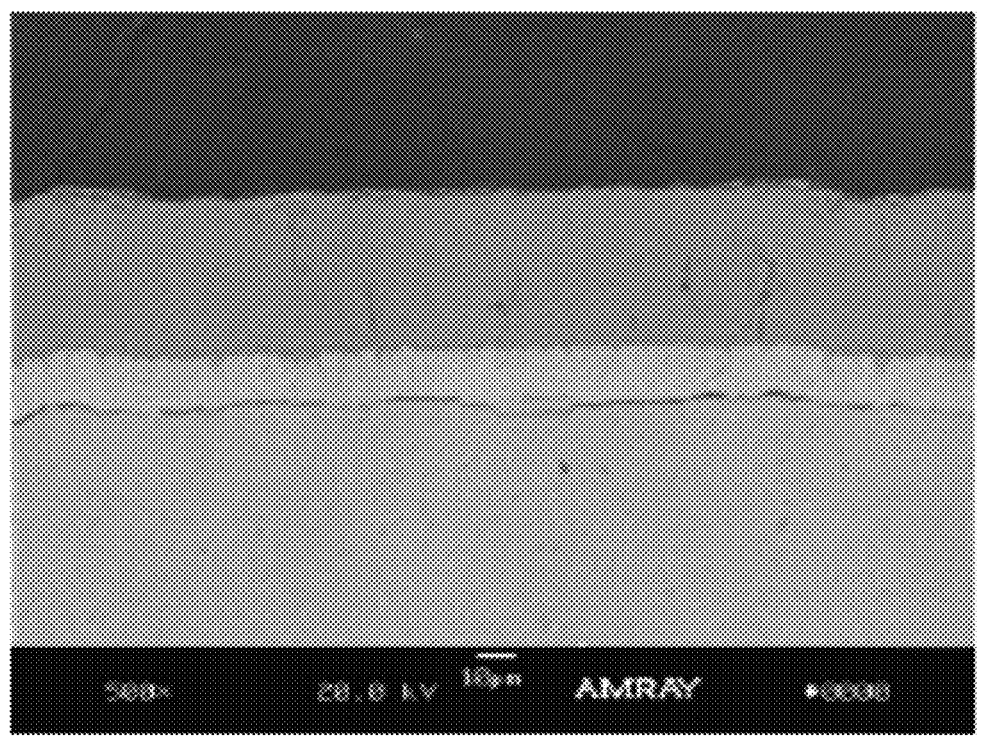
FIG. 19 is a cross section SEM image of the precursor to the 300 series product.

The herein described products which include a stainless steel layer or region carried by a steel or carbon steel substrate or core can be manufactured by the low temperature deposition of chromium onto a starting substrate that becomes the core region. Available techniques for the deposition of chromium onto the starting substrate include, but are not limited to, physical vapor deposition, chemical vapor deposition, metal-organic chemical vapor deposition, sputtering, ion implantation, electroplating, electroless plating, pack cementation, the ONERA process, salt bath processes, chromium-cryolite processes, Alphatising process, or the like. In one preferable example, the chromium is deposited in a non-compact layer upon the starting substrate. In another preferable example, the chromium is deposited as a layer that consists essentially of chromium. FIGS. 14 and 15 show EDX and scanning electron microscopy (SEM) data of the as-deposited chromium layer on the carbon steel substrate. FIG. 14 shows the approximate weight percentages of the as-deposited chromium and iron in the carbon steel substrate. FIG. 15 shows an SEM image of the cross section of the chromium deposited on the carbon steel substrate. In still another preferable example, the chromium is deposited as an admixture of iron and chromium. In yet another preferable example, the chromium is deposited as an admixture of chromium and an element selected from the group consisting of nickel, molybdenum, titanium, niobium, tantalum, vanadium, tungsten, copper, and a mixture thereof. In still yet another preferable example, a plurality of layers of chromium and an element selected from the group consisting of nickel, molybdenum, titanium, niobium, tantalum, vanadium, tungsten, copper, and a mixture thereof are deposited onto the starting substrate. FIGS. 18 and 19 show EDX and SEM data of as-deposited nickel and chromium layers on the carbon steel substrate. FIG. 18 shows the approximate weight percentages of the as-deposited chromium, as-deposited nickel, and iron in the carbon steel substrate. FIG. 19 shows an SEM image of the cross section of the chromium and nickel carried by the carbon steel substrate.

Figure 16:
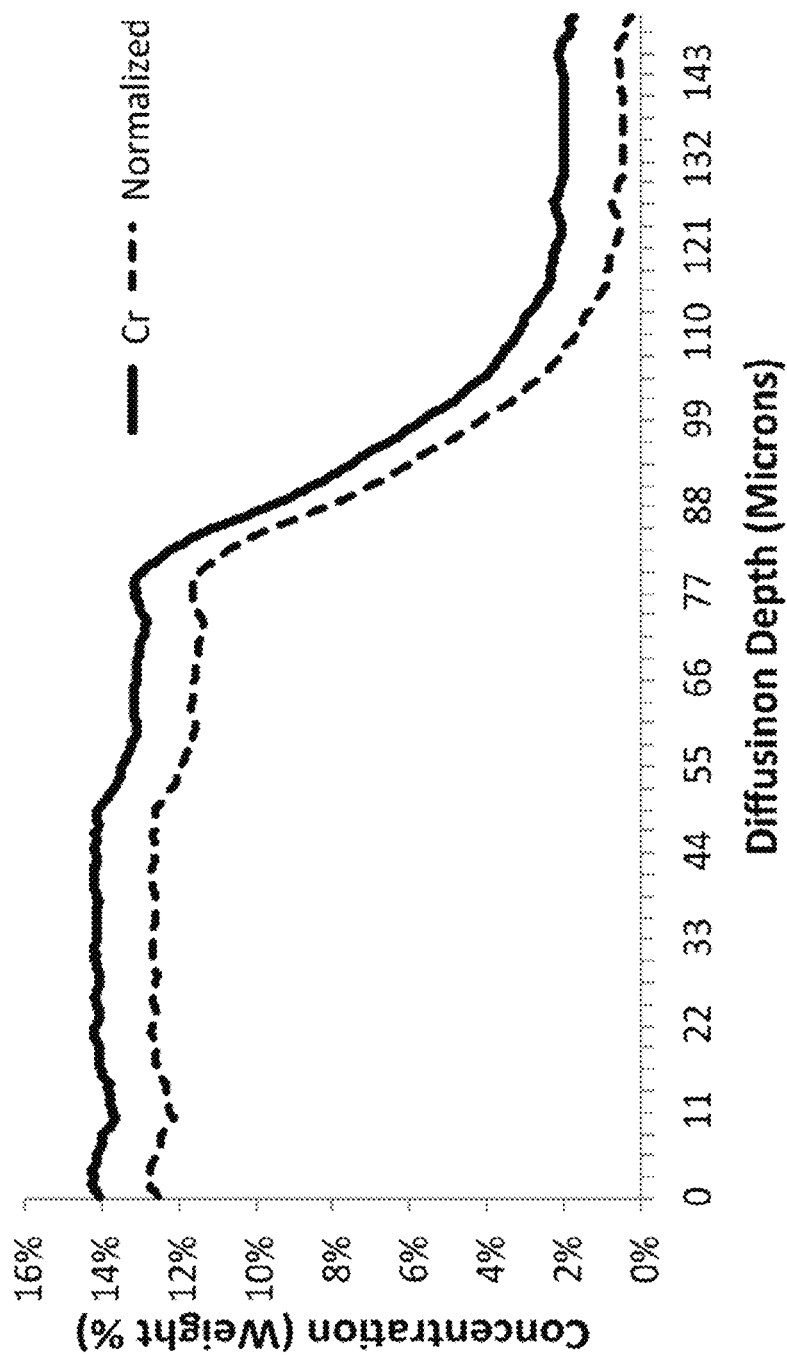
FIG. 16 is a plot of chromium concentrations as a function of depth for a 400 series product, (solid line) the energy-dispersive X-ray spectroscopy (EDX) data as measured, (dashed line) the EDX data normalized for the concentration of chromium in the core.
Figure 17:
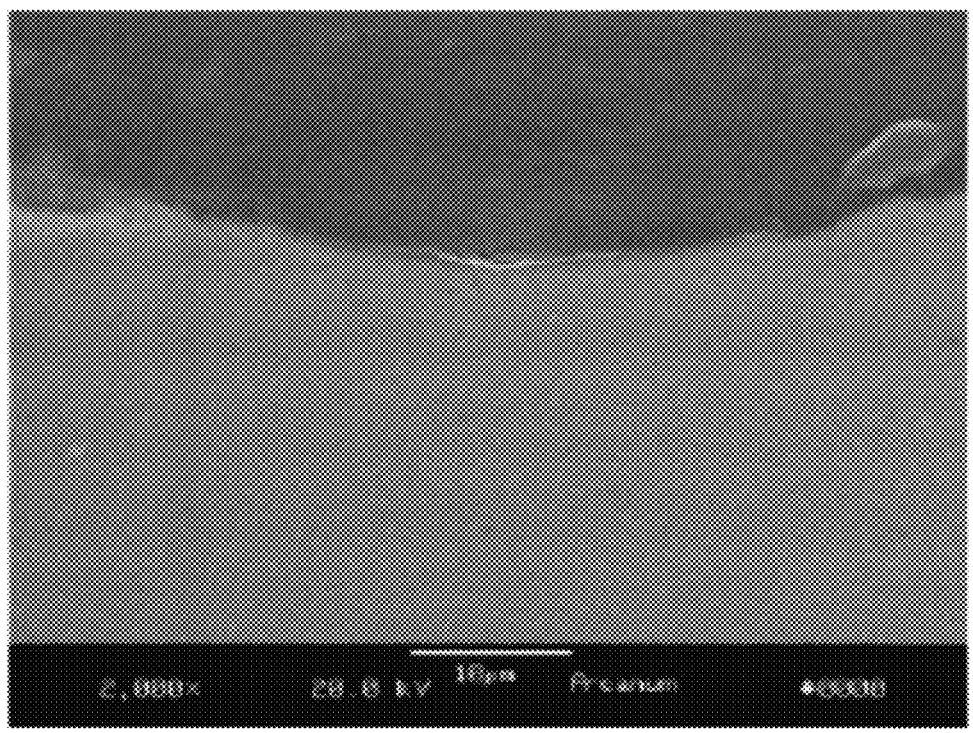
FIG. 17 is a cross section SEM image of the 400 series product.

Following the deposition of the chromium onto the starting substrate, the deposited chromium and any other deposited metals are heated to a temperature in a range of about 800° C. to about 1200° C., or about 1000° C. FIGS. 16 and 17 show EDX and SEM data of a 400 series stainless steel carried by a carbon steel core that was made by heating the deposited chromium, e.g., as shown in FIGS. 14 and 15. FIG. 16 shows the approximate weight percentage of chromium (as measured and normalized) as a function of depth. The stainless steel region is comparable to a stainless steel composition designation selected from the group consisting of 403 SS, 405 SS, 409 SS, 410 SS, 414 SS, 416 SS, 420 SS, and 422 SS. The designation of the composition of the stainless steel layer can be affected by the concentration of trace elements in the carbon steel substrate (e.g., nickel, carbon, manganese, silicon, phosphorus, sulfur, and nitrogen), by the addition of one or more trace elements to the as deposited chromium, or by the addition of one or more trace elements by post treatment of the as-deposited chromium (e.g., by solution, deposition, or ion implantation methods). FIG. 17 shows an SEM cross section of the stainless steel region, bonding region and core regions notably omitting any observable distinction (e.g., interface) between the respective regions.

Figure 20:
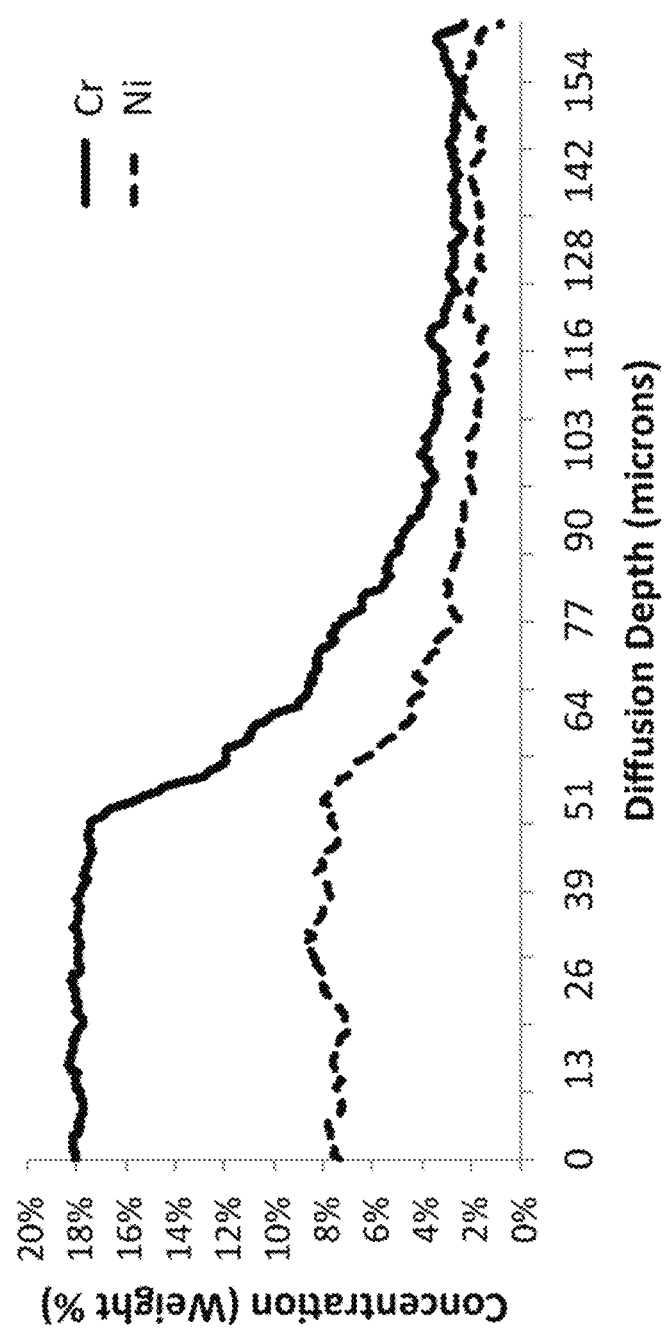
FIG. 20 is a plot of chromium and nickel concentrations as a function of depth for a 300 series product.
Figure 21:
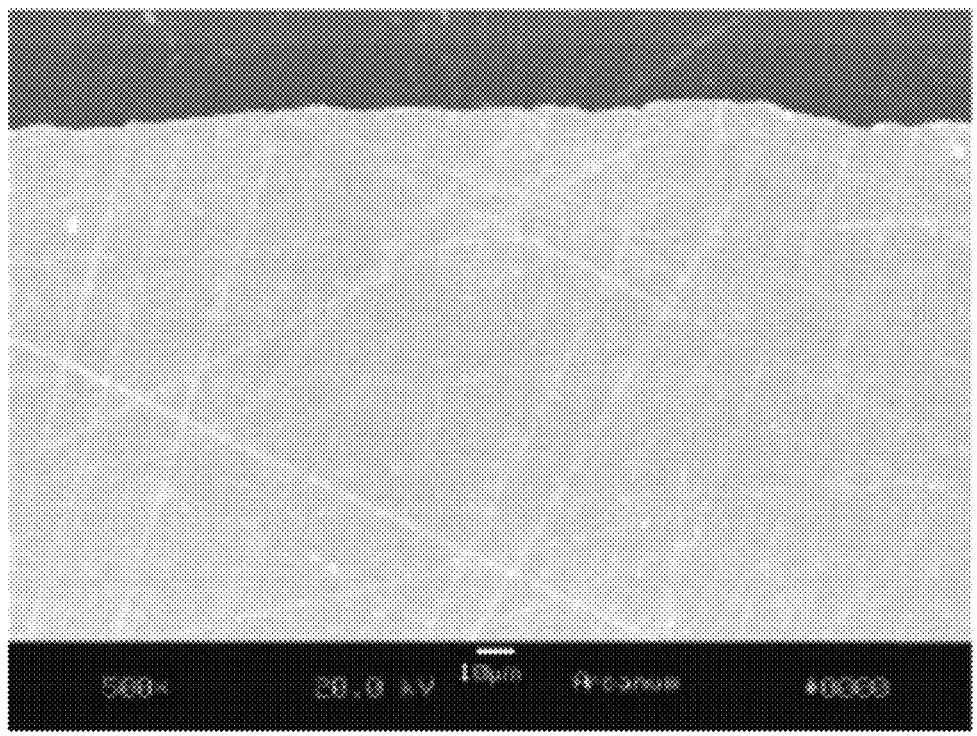
FIG. 21 is a cross section SEM image of the 300 series product.
Figure 22:
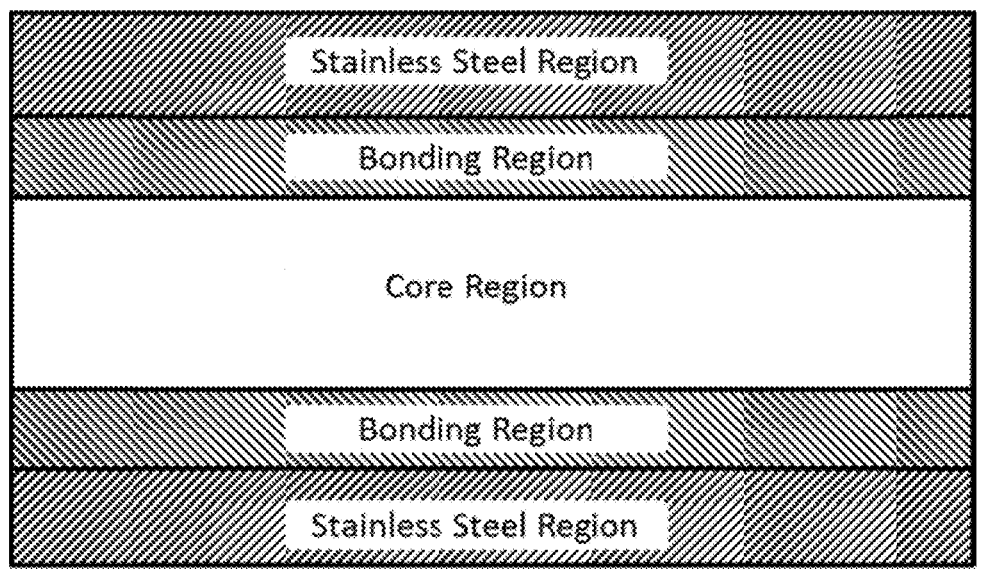
FIG. 22 is a schematic of one embodiment described herein.

FIGS. 20 and 21 show EDX and SEM data of a 300 series stainless steel carried by a carbon steel core that was made by heating the deposited chromium, e.g., as shown in FIGS. 18 and 19. FIG. 20 shows the approximate weight percentages of chromium and nickel as a function of depth. The stainless steel region is comparable to a stainless steel composition designation selected from the group consisting of 301 SS, 302 SS, 303 SS, and 304 SS. Other The designation of the composition of the stainless steel layer can be affected by the concentration of trace elements in the carbon steel substrate (e.g., carbon, manganese, silicon, phosphorus, sulfur, and nitrogen), by the addition of one or more trace elements to the as deposited chromium, or by the addition of one or more trace elements by post treatment of the as-deposited chromium (e.g., by solution, deposition, or ion implantation methods). Furthermore, the designation of the composition of the stainless steel is affected by the concentrations of the chromium and nickel in the stainless steel layer; these concentrations can be increased or decreased independently. FIG. 21 shows a SEM cross section of the stainless steel region, bonding region and core regions notably omitting any observable distinction (e.g., interface) between the respective regions.

The determination of the thickness and composition of the stainless steel region, bonding region, and optionally the core region is determined by cross-sectional analysis of a sample of the herein described products. Preferably, the sample is defined by a 1 cm by 1 cm region of the face of the product. The sample is then cut through the center of the 1 cm by 1 cm region and the face exposed by the cut is polished on a Buehler EcoMet 250 ginder-polisher. A five step polishing process includes 5 minutes at a force of 6 lbs. with a Buehler 180 Grit disk, 4 minutes at a force of 6 lbs. with a Hercules S disk and a 6 µm polishing suspension, 3 minutes at a force of 6 lbs. with a Trident 3/6 µm disk and a 6 µm polishing suspension, 2 minutes at a force of 6 lbs. with a Trident 3/6 µm disk and a 3 µm polishing suspension, and then 1.5 minutes at a force of 6 lbs. with a microcloth disk and a 0.05 µm polishing suspension. The cut and polished face is then in an instrument capable of energy-dispersive X-ray spectroscopy (EDX). The above provided grinding-polishing procedure may cross-contaminate distinct layers, as expected the contamination can be consistent across the polished face. Therefore, a baseline measurement of a region that is free of a first element may display a greater than baseline concentration of the first element by EDX (see, for example, FIG. 16). The increase in the base line is dependent on the area of the regions polished and the concentration of the respective elements in the polished faces.

In preferable examples of the above described embodiments, the stainless steel region has a thickness in a range of about 10 µm to about 110 µm. More preferably, the stainless steel region has a thickness of about 30 µm to about 90 µm, about 45 µm to about 75 µm, or about 60 µm.

Figure 12:
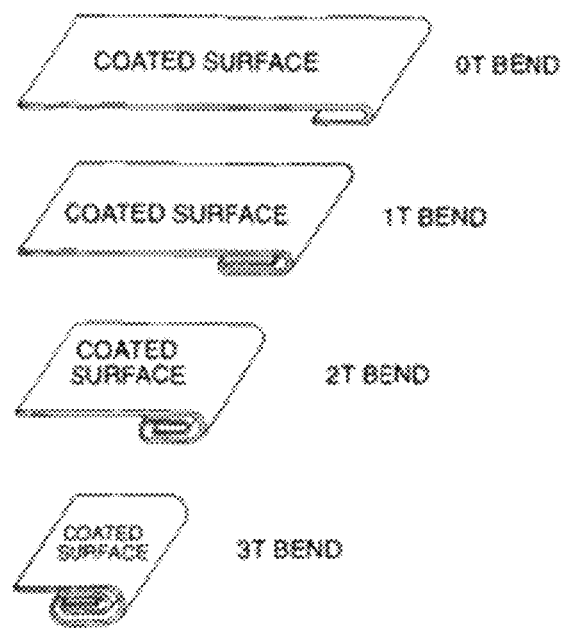
FIG. 12 is a depiction of bends in a Standard T-bend Test.
Figure 13:
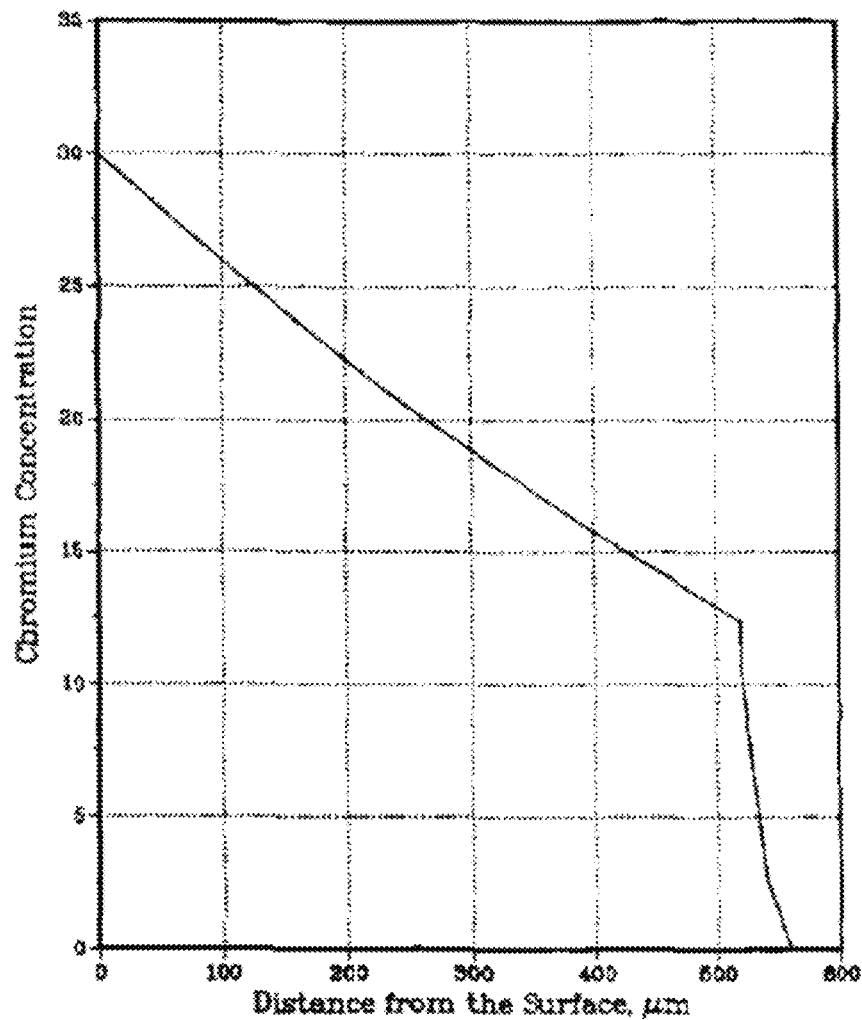
FIG. 13 is a plot of chromium concentration as a function of depth for chromized steel (prior art)

Standard T-Bend Tests are a means of evaluating the flexibility of a coating on a strip of metal. Multiple 180° bends of the coated metal are made, and the amount of cracking produced at each bend is visually determined. Ratings are classified as 0T, 1T, 2T, 3T and so on (see FIG. 12). The 0T bend consists of making a 180° bend with the coating on the outside of the bend and pressing the bend flat so there is no space between the metal surfaces. The test results are reported as passing the smallest T-bend on which cracks are not observed (i.e., a material that passes the 0T-bend test does not show cracking in the 0T-bend). In some cases, cracking can be detected by removal of a pressure-sensitive tape place on the bend edges (i.e., material does not delaminate from metal with removal of the pressure-sensitive tape). ASTM D4145 provides a test method for coating flexibility of prepainted sheets which can be adapted by the substitution of the herein described coated materials for the painted sheets.

Herein, an Advanced T-Bend Test replaces the visual cracking/delamination determination of the coated metal with both SEM and EDS analysis of the coated surface at the point of maximum elongation. The Advanced T-Bend Test results are reported as the smallest T-bend on which the materials passed both the SEM analysis and the EDS analysis.

Figure 2:
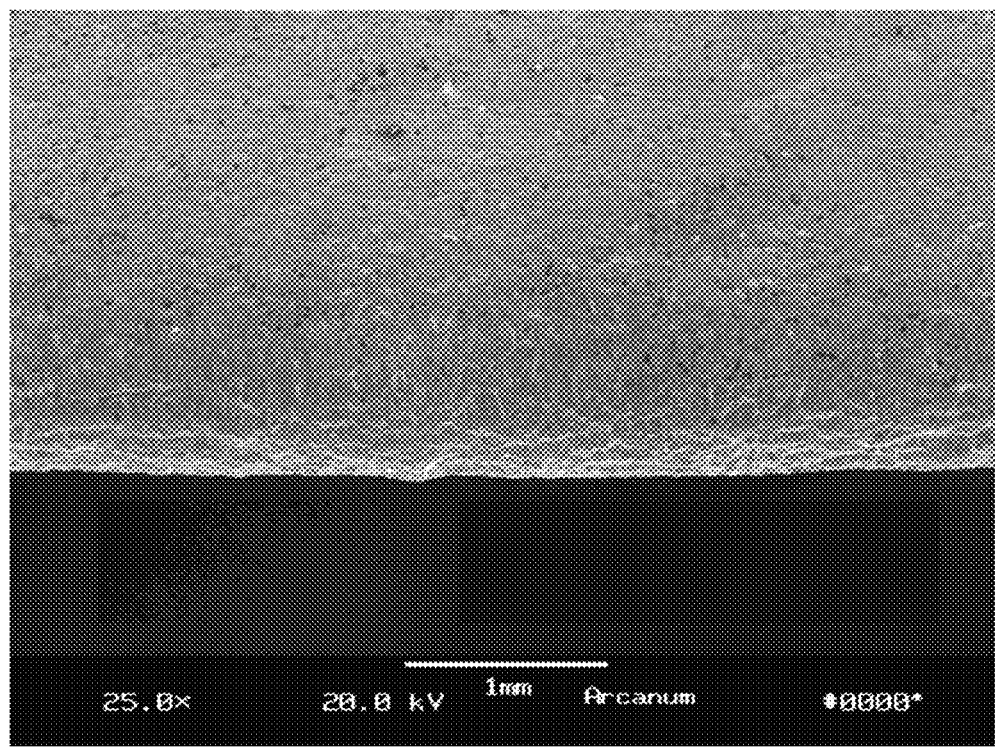
FIG. 2 is an SEM image at 25× of the surface and bend of the product in FIG. 1.
Figure 3:
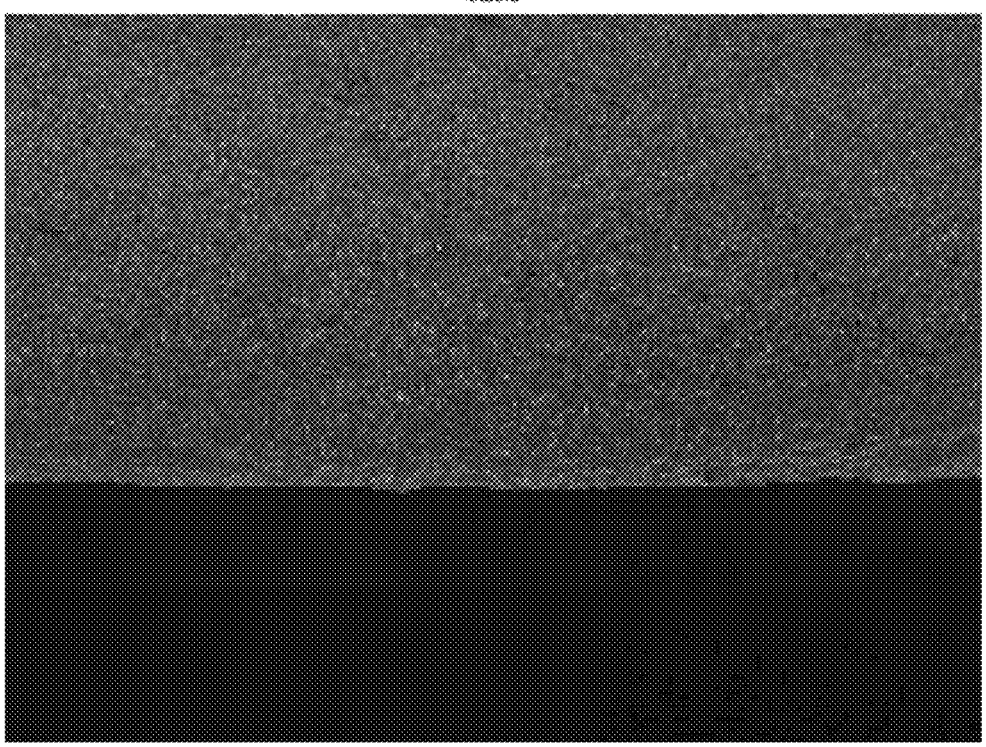
FIG. 3 is an EDS image of the product shown in FIG. 2 wherein green is chromium and red is iron.
Figure 4:
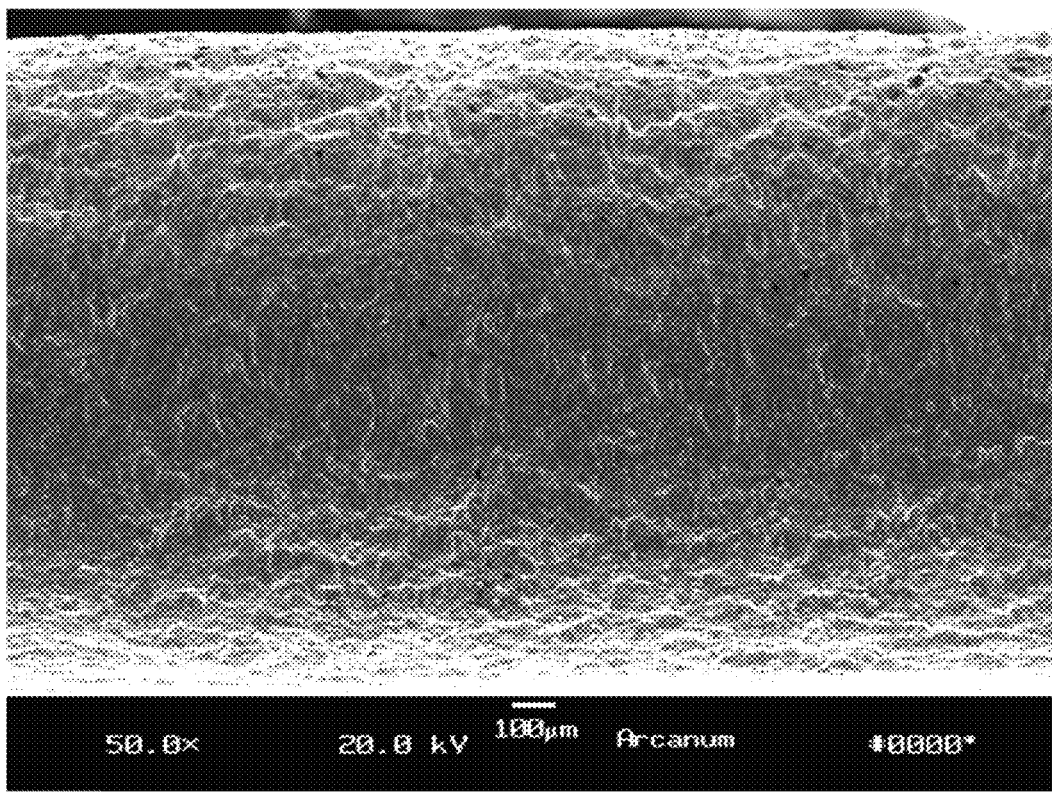
FIG. 4 is an SEM image at 50× of the point of maximum elongation in a 0T-bend for a herein described product that passes the 0T-bend Advanced T-Bend Test.
Figure 5:
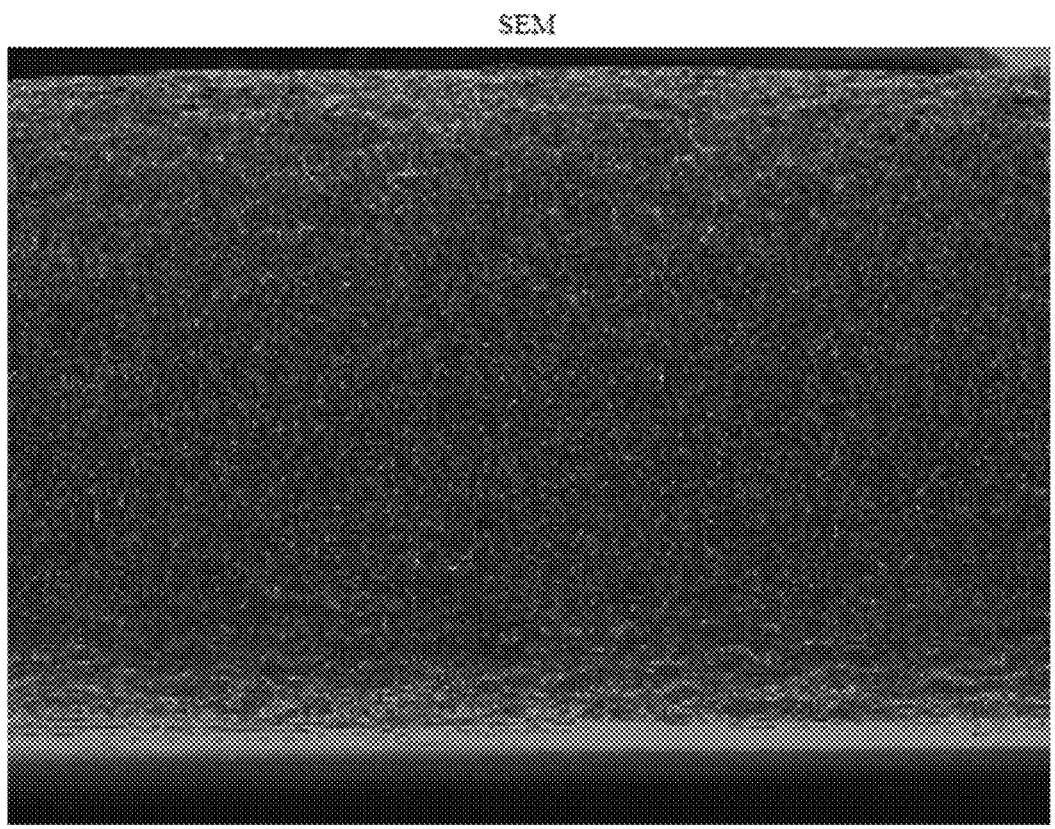
FIG. 5 is an EDS image of the product shown in FIG. 4 wherein green is chromium and red is iron.
Figure 6:
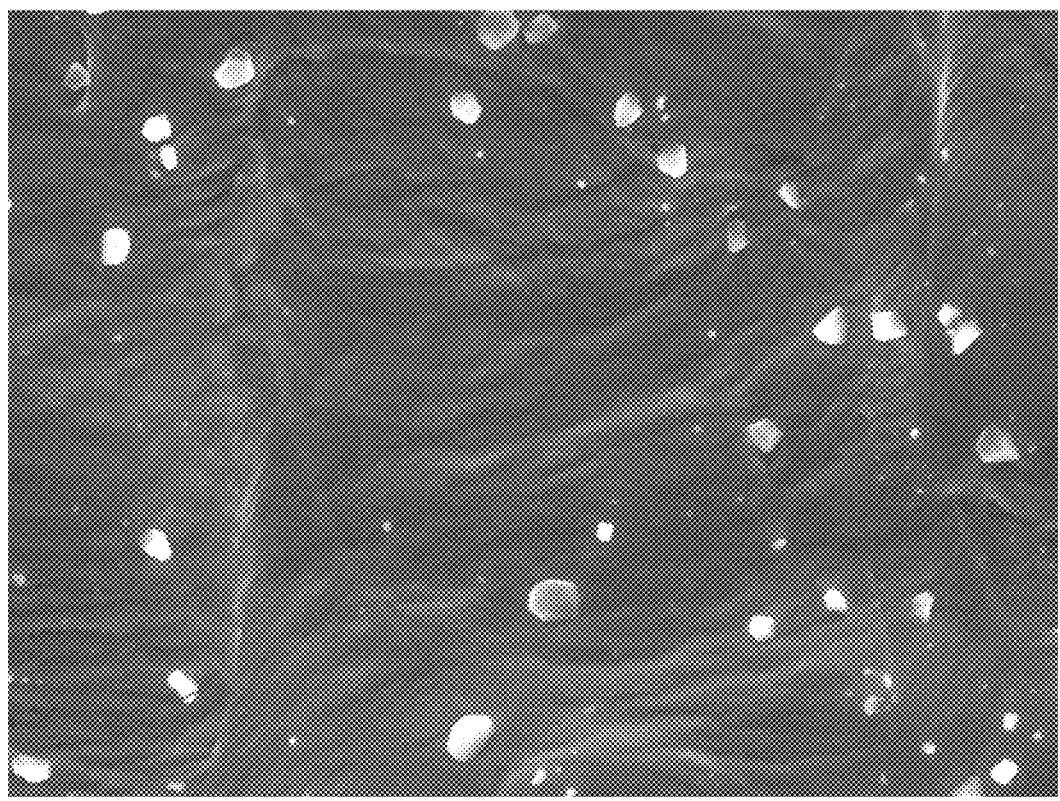
FIG. 6 is an SEM image at 2000× of the point of maximum elongation in a 0T-bend for a herein described product that passes the 0T-bend Advanced T-Bend Test.
Figure 7:
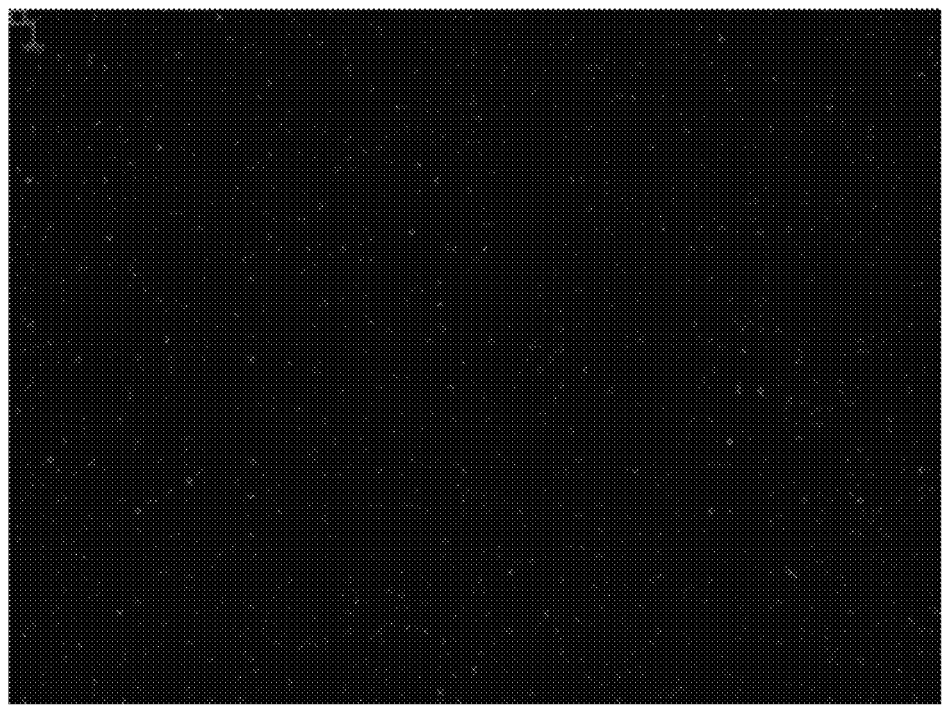
FIG. 7 is an EDS image of the product shown in FIG. 6 showing chromium in green.
Figure 8:
FIG. 8 is an EDS image of the product shown in FIG. 6 showing iron in red.
Figure 9:
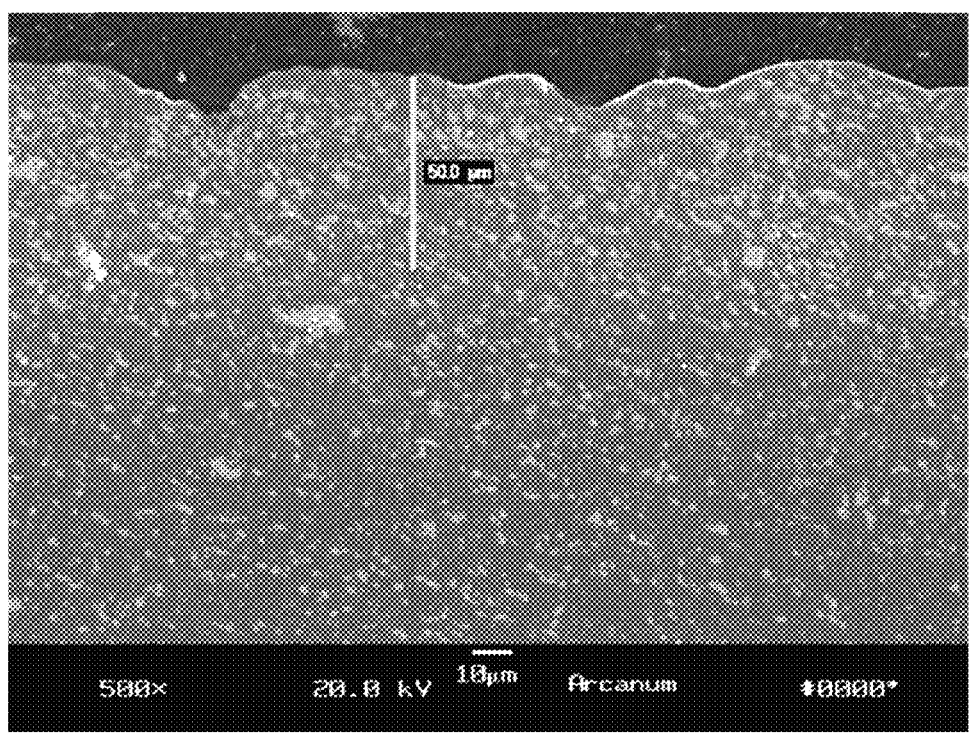
FIG. 9 is an SEM image of the cross section of the 0T-bend for a product described herein.
Figure 11:
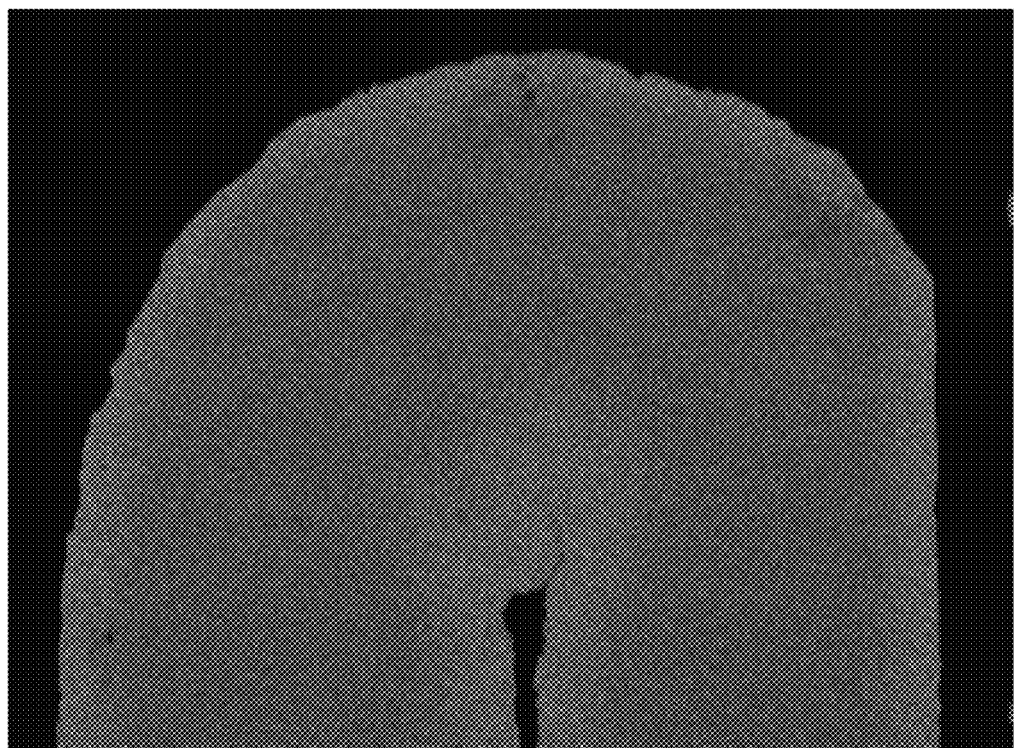
FIG. 11 is an SEM image at 85× of the 0T-bent for a product described herein, with chromium shown in red.

The SEM aspect of the Advanced T-Bend Test is reported as the smallest T-bend (at the point of maximum elongation) that does not show cracking or delamination of the surface as determined by SEM analysis of the T-bend. Cracking at the point of maximum elongation can be determined by comparing the surface of the T-bend to a non-bent section of the metal. FIGS. 1, 2, and 4 show SEM images of the surface of materials having undergone a 0T-bend. The materials pictured in FIGS. 1, 2, and 4 pass the cracking aspect of a 0T-bend Advanced T-Bend Test. Delamination at the point of maximum elongation can be determined by SEM analysis of the cross section of the material at the T-bend, preferably by backscattering SEM analysis of the material at the T-bend. Backscattering SEM analysis highlights points of delamination between the surface and the core material. The material pictured in FIGS. 9, 10 (backscattering), and 11 pass the delamination aspect of a 0T-bend Advanced T-Bend Test. Notably, the analysis of delamination test must include the core, bonding, and stainless steel regions. In FIGS. 9, 10, and 11, the bonding region ends at about 50 μm from the surface and therefore any delamination should be observed at a point between the surface and a depth of about 50 μm.

The EDS aspect of the Advanced T-Bend Test is reported as the smallest T-bend that shows a composition (wt. %) along the T-bend that is substantially similar, preferably the same as the composition along a non-bent section of the metal. That is, the surface composition at the point of maximum elongation has a composition that is substantially similar, preferable the same as the surface composition along a non-bent section of the metal (e.g., the same as the composition of the stainless steel region). Notably, the thickness of the stainless steel and bonding region will be affected by the bend and is not wholly indicative of whether a material passes the test. By way of example, the materials pictured in FIGS. 3, 5, 7, 8, and 11 show EDS images of the surface of materials that pass the EDS aspect of a 0T-bend Advanced T-Bend Test.

A material that passes the SEM aspect at a 0T-bend but fails the EDS aspect at a 0T-bend (but hypothetically passes the EDS aspect at a 1T-bend) is reported as passing the lowest bend for both aspects, that is the 1T-bend.

The herein described products pass a 0T-bend Standard T-Bend Test and, preferably pass the 0T-bend Advanced T-Bend Test. That is, the herein described products (as shown in FIGS. 1-11) do not crack and maintains a surface composition that is substantially consistent with, or the same as the composition along a non-bent section of the metal. When products carry include first and second stainless steel regions, passage of the 0T-bend Advanced T-Bend Test is not dependent on the bending, straightening, and rebending of the product; that is, the first and second stainless steel regions are individually considered.

What is claimed:

1. A steel form that passes a 0T-bend Advanced T-Bend Test and has a stainless steel exterior, the steel form comprising:
   a core region, a bonding region and a stainless steel region;
   the core region metallurgically bonded to the stainless steel region by the bonding region; the core region comprising at least 55 wt. % iron;
   the stainless steel region having a thickness of about 5 μm to about 250 μm, having a stainless steel composition, and including the stainless steel exterior, the stainless steel composition having a chromium concentration of about 10 wt. % to about 30 wt. % that varies by less than 5 wt. %; and
   the bonding region positioned between the stainless steel region and the core region, the bonding region having a thickness that is greater than 1 μm and less than the thickness of the stainless steel region, and having a bonding composition, the bonding composition having a chromium concentration proximal to the stainless steel region that is approximately equal to the chromium concentration of the stainless steel region and having a chromium concentration proximal to the core region that has less than about 5 wt. % chromium;
   wherein the steel form passes the 0T-bend Advanced T-Bend Test.

2. The steel form of claim 1, wherein the stainless steel region has a thickness in a range of about 10 μm to about 110 μm.

3. The steel form of claim 1, wherein the core region is substantially free of chromium.

4. The steel form of claim 1, wherein the stainless steel composition comprises an admixture of iron, chromium, and a transition metal selected from the group consisting of nickel, molybdenum, titanium, niobium, tantalum, vanadium, tungsten, copper, and a mixture thereof.

5. The steel form of claim 1, wherein the stainless steel composition comprises an admixture of iron, chromium, and nickel; wherein the stainless steel composition comprises a nickel concentration of about 5 wt. % to about 20 wt. %; and wherein the bonding composition consists essentially of iron, chromium and nickel.

6. The steel form of claim 5, wherein the stainless steel composition comprises a chromium concentration of about 16 wt. % to about 25 wt. % and nickel concentration of about 6 wt. % to about 14 wt. %.

7. The steel form of claim 1, wherein the stainless steel composition comprises a chromium concentration of about 10.5 wt. % to about 18 wt. %.

8. A steel sheet comprising:
   a first stainless steel region having a thickness of about 5 μm to about 250 μm;
   a first bonding region positioned between the first stainless steel region and a core region, the first bonding region having a thickness that is greater than 1 μm and less than the thickness of the first stainless steel region;
   the core region having a thickness of about 100 μm to about 4 mm, the core region having a core composition that comprises at least 85 wt. % iron;
   a second bonding region positioned between the core region and a second stainless steel region;
   the second stainless steel region having a thickness of about 5 μm to about 250 μm;
   the second bonding region having a thickness that is greater than 1 μm and less than the thickness of the second stainless steel region;

the first and second stainless steel regions having stainless steel compositions, individually, comprising an admixture of iron and chromium, and a chromium concentration of about 10 wt. % to about 30 wt. % that varies by less than 5 wt. %; and the first and second bonding regions having bonding compositions, the bonding composition, individually, comprising an admixture of iron and chromium, having a chromium concentration proximal to the respective stainless steel region that is approximately equal to the chromium concentration of the stainless steel region and having a chromium concentration proximal to the core region that has less than about 5 wt. % chromium;

wherein the steel sheet passes the 0T-bend Advanced T-Bend Test.

9. The steel sheet of claim 8, wherein the first and second stainless steel composition, individually, comprises an admixture of iron, chromium, and nickel, and comprises a nickel concentration of about 5 wt. % to about 20 wt. %; and wherein the respective first and second bonding compositions further comprise nickel.

10. The steel sheet of claim 8, wherein the first and second stainless steel composition, individually, comprises an admixture of iron, chromium, and a transition metal selected from the group consisting of nickel, molybdenum, titanium, niobium, tantalum, vanadium, tungsten, copper, and a mixture thereof.

11. The steel sheet of claim 8, wherein the core region has a thickness of about 100 μm to about 1 mm.

12. The steel sheet of claim 8, wherein the core region has a thickness of about 100 μm to about 0.5 mm.

13. The steel sheet of claim 8 further comprising a steel sheet thickness of about 0.1 mm to about 4 mm.

14. The steel sheet of claim 13, wherein the steel sheet thickness is about 0.1 mm to about 2 mm.

15. The steel sheet of claim 14, wherein the steel sheet thickness is about 0.1 mm to about 1 mm.

16. A steel form comprising:

a brushed or polished stainless steel surface carried by a stainless steel region;

the stainless steel region having a thickness of about 5 μm to about 200 μm, having an stainless steel composition that includes an admixture of iron and chromium, and a chromium concentration of about 10 wt. % to about 30 wt. % that varies by less than 5 wt. %, the stainless steel region carried by a bonding region;

the bonding region having a thickness of about 5 μm to about 200 μm but less than the thickness of the stainless steel region, the bonding region metallurgically bonding the stainless steel region to a core region;

the core region having a core composition that includes at least 85 wt. % iron;

the bonding region further comprising a bonding composition that includes an admixture of iron and chromium, and a bonding region concentration gradient that decreases from a chromium concentration proximal to the stainless steel region that is approximately equal to the chromium concentration of the stainless steel region to a chromium concentration proximal to the core region that is less than about 1 wt. %;

wherein the steel form passes the 0T-bend Advanced T-Bend Test.

17. The steel form of claim 16, wherein the steel form comprises a steel sheet having two major surfaces, wherein the stainless steel region and the bonding region are carried by one major surface of the steel sheet, and wherein the steel form has a thickness of about 0.1 mm to about 2 mm.

* * * * *